US011475829B2

(12) United States Patent
Halbritter et al.

(10) Patent No.: US 11,475,829 B2
(45) Date of Patent: Oct. 18, 2022

(54) OPTOELECTRONIC LIGHT EMITTING DEVICE WITH A PWM TRANSISTOR AND METHOD FOR MANUFACTURING OR CONTROLLING AN OPTOELECTRONIC LIGHT EMITTING DEVICE

(71) Applicant: OSRAM Opto Semiconductors GmbH, Regensburg (DE)

(72) Inventors: Hubert Halbritter, Dietfurt-Toeging (DE); Jens Richter, Hemau (DE)

(73) Assignee: OSRAM OPTO SEMICONDUCTORS GMBH, Regensburg (DE)

( * ) Notice: Subject to any disclaimer, the term of this patent is extended or adjusted under 35 U.S.C. 154(b) by 0 days.

(21) Appl. No.: 17/311,095

(22) PCT Filed: Dec. 3, 2019

(86) PCT No.: PCT/EP2019/083493
§ 371 (c)(1),
(2) Date: Jun. 4, 2021

(87) PCT Pub. No.: WO2020/115042
PCT Pub. Date: Jun. 11, 2020

(65) Prior Publication Data
US 2021/0335219 A1    Oct. 28, 2021

(30) Foreign Application Priority Data
Dec. 5, 2018  (DE) .................. 10 2018 131 023.4

(51) Int. Cl.
*G09G 3/32* (2016.01)
*H01L 25/075* (2006.01)

(52) U.S. Cl.
CPC ........... *G09G 3/32* (2013.01); *H01L 25/0753* (2013.01); *G09G 2320/064* (2013.01)

(58) Field of Classification Search
CPC ............... G09G 2320/064; G09G 3/32; G09G 2300/0417; G09G 3/2011; G09G 3/2077; G09G 3/2014; H01L 25/0753
See application file for complete search history.

(56) References Cited

U.S. PATENT DOCUMENTS 6,949,452 B2 * 9/2005 Hatano ................. H01L 27/12
438/149
7,071,932 B2 * 7/2006 Libsch ................. G09G 3/3233
345/82

(Continued)

FOREIGN PATENT DOCUMENTS

DE         600 34 401 T2    8/2007
DE    10 2008 018 236 A1   10/2009

OTHER PUBLICATIONS

International Search Report issued for corresponding International Patent Application No. PCT/EP2019/083493 dated Apr. 17, 2020, along with an English translation.

(Continued)

*Primary Examiner* — Muhammad N Edun
(74) *Attorney, Agent, or Firm* — Hauptman Ham, LLP

(57) ABSTRACT

An optoelectronic light emitting device includes an optoelectronic semiconductor component configured to generate light, a current source configured to generate a current, and a PWM transistor driven by a pulse-width modulated signal. The PWM transistor enters a first state or a second state based on said pulse-width modulated signal. The PWN transistor is configured to supply the optoelectronic semiconductor component with the current generated by the current source in the first state and to decouple it from the current generated by the current source in the second state. The current source is manufactured by a first technology and the PWM transistor is manufactured by a second technology.

14 Claims, 10 Drawing Sheets

(56) References Cited

U.S. PATENT DOCUMENTS

| | | | |
|---|---|---|---|
| 10,714,001 B2* | 7/2020 | Cok | H01L 25/048 |
| 2005/0168417 A1* | 8/2005 | Ha | G09G 3/3233 |
| | | | 345/76 |
| 2008/0225027 A1 | 9/2008 | Toyomura et al. | |
| 2008/0258695 A1 | 10/2008 | Kumar et al. | |
| 2011/0057932 A1 | 3/2011 | Missbach et al. | |
| 2016/0315101 A1 | 10/2016 | Afzali-Ardakani et al. | |
| 2017/0270850 A1 | 9/2017 | Pappas et al. | |
| 2018/0151132 A1 | 5/2018 | Lee et al. | |
| 2018/0182279 A1 | 6/2018 | Sakariya et al. | |
| 2018/0247586 A1 | 8/2018 | Vahid Far et al. | |

OTHER PUBLICATIONS

Written Opinion issued for corresponding International Patent Application No. PCT/EP2019/083493 dated Apr. 17, 2020.

* cited by examiner

OPTOELECTRONIC LIGHT EMITTING DEVICE WITH A PWM TRANSISTOR AND METHOD FOR MANUFACTURING OR CONTROLLING AN OPTOELECTRONIC LIGHT EMITTING DEVICE

CROSS REFERENCE TO RELATED APPLICATION

This application is a National Stage of International Application No. PCT/EP2019/083493, filed on Dec. 3, 2019, which designates the United States and was published in Europe, and which claims priority to German Patent Application No. 10 2018 131 023.4, filed on Dec. 5, 2018, in the German Patent Office. Both of the aforementioned applications are hereby incorporated by reference in their entireties.

The present application claims the priority of German Patent Application No. 10 2018 131 023.4, filed with the German Patent and Trademark Office on Dec. 5, 2018. The disclosure content of German Patent Application No. 10 2018 131 023.4 is hereby incorporated into the disclosure content of the present application.

The present invention relates to an optoelectronic light emitting device with a PWM transistor, a method for manufacturing an optoelectronic light emitting device, and a method for controlling an optoelectronic light emitting device.

Conventional LED (light emitting diode) displays are operated with pulse-width modulation (PWM), also called pulse width modulation, pulse duration modulation or pulse length modulation. With a shortest PWM pulse duration of, for example, 10 ns, a dynamic range of approx. 20 bits can be mapped at 60 Hz, including the bits for grayscale, dimming, calibration and white point. For some applications, this may not be sufficient. Additional analog current dimming of the LEDs is only possible to a limited extent in the conventional way. Furthermore, pulses with a duration of 10 ns cannot be realized with conventional TFT (English: thin-film transistor) technology.

The present invention is based, inter alia, on the object of creating an advantageous optoelectronic light emitting device, in particular with a large dynamic range, which can be realized at low cost. Furthermore, a display with an optoelectronic light emitting device, a method for controlling an optoelectronic light emitting device and a method for manufacturing an optoelectronic light emitting device are to be disclosed.

An object of the invention is solved by an optoelectronic light emitting device having the features of claim 1. An object of the invention is further solved by a display having the features of claim 12. Furthermore, an object of the invention is solved by a method for controlling an optoelectronic light emitting device having the features of claim 13 and a method for manufacturing an optoelectronic light emitting device having the features of claim 14. Advantageous embodiments and further developments of the invention are indicated in the dependent claims.

An optoelectronic light emitting device comprises an optoelectronic semiconductor component, a current source, and a PWM transistor. The optoelectronic semiconductor component is configured to generate light. The current source is configured to generate a current. The PWM transistor can be driven with a pulse-width modulated signal or is driven with such a signal. Depending on the pulse width modulated signal, the PWM transistor may enter a first state or a second state. When the PWM transistor is in the first state, the optoelectronic semiconductor component is supplied with current generated by the current source. When the PWM transistor is in the second state, the optoelectronic semiconductor component is decoupled from the current generated by the current source.

The current source is manufactured or realized by means of a first technology, while the PWM transistor is manufactured or realized by means of a second technology, which is different from the first technology.

This makes it possible to realize only the PWM transistor in a technology that allows a high dynamic range, and to realize the current source and in particular other parts of the optoelectronic light emitting device in a more cost-effective technology.

The current source may comprise transistors realized in the first technology.

In order to be able to supply the optoelectronic semiconductor component with the current generated by the current source in the first state of the PWM transistor and to decouple it from the current generated by the current source in the second state of the PWM transistor, the PWM transistor can be designed in such a way that its current-carrying path is of low resistance, i.e. electrically conductive, in one of the two states and of high resistance, i.e. electrically non-conductive, in the other state. The PWM transistor can, for example, be designed as a field-effect transistor (FET). In this case, the drain-source path is the current-carrying path of the PWM transistor.

The optoelectronic semiconductor component may, for example, be a light emitting diode (LED), an organic light emitting diode (OLED), a light emitting transistor or an organic light emitting transistor. In various embodiments, the optoelectronic semiconductor component may be part of an integrated circuit.

The optoelectronic semiconductor component can be realized in particular as an optoelectronic semiconductor chip.

In addition to the semiconductor optoelectronic component, the current source, and the PWM transistor, the optoelectronic light emitting device may also comprise other semiconductor elements and/or components.

The optoelectronic light emitting device can comprise one or more optoelectronic semiconductor components. It may be provided that a current source as well as a PWM transistor are assigned to each of the optoelectronic semiconductor components.

Each of the semiconductor optoelectronic components may form a respective subpixel of a pixel. For example, a respective pixel may contain three subpixels for the colors red, green, and blue.

The second technology, with which the PWM transistor is manufactured, can have a higher charge carrier mobility than the first technology. This makes it possible to realize a faster modulating transistor.

Furthermore, the first technology may be a TFT technology. The feature that the current source is manufactured using TFT technology may be understood in such that the transistors of the current source are TFT transistors, i.e., thin-film transistors. For example, the TFT transistors may be IGZO (indium gallium zinc oxide) or LTPS (low-temperature polycrystalline silicon) transistors.

The second technology can be a c-Si technology. The PWM transistor can be made of crystalline silicon.

According to one embodiment, the optoelectronic semiconductor component, the current source and the PWM transistor or the current-carrying path of the PWM transistor are connected in series. In this case, the current carrying path in the first state of the PWM transistor is low impedance to supply the optoelectronic semiconductor component with the current generated by the current source.

There are various ways to connect the optoelectronic semiconductor component, the current source, and the PWM transistor in series. For example, the optoelectronic semiconductor component can be connected between the current source and the PWM transistor, or the current source can be connected between the optoelectronic semiconductor component and the PWM transistor, or the PWM transistor can be connected between the optoelectronic semiconductor component and the current source.

According to a further embodiment, the optoelectronic semiconductor component and the PWM transistor may be connected in parallel. The PWM transistor may be connected to the optoelectronic semiconductor component such that the PWM transistor short-circuits the optoelectronic semiconductor component when the PWM transistor is in the second state.

The PWM transistor can be an integrated circuit (IC), in particular an application-specific integrated circuit (ASIC), or integrated into an IC or an ASIC.

In particular, the PWM transistor can be a µIC, i.e. a micro-IC, or integrated into a µIC. A µIC has only a very thin substrate or no substrate at all, which makes it possible to manufacture it with small lateral expansions.

The PWM transistor can further be realized as a hybrid, for example as a printable µ-transistor, i.e. micro-transistor, or can be manufactured locally by means of a laser beam as a recrystallized single transistor.

The optoelectronic semiconductor component can be a µLED, i.e. a micro-LED. Analogous to a µIC, a µLED has only a very thin substrate or no substrate at all.

The PWM transistor can be integrated into the µLED as an active substrate, which reduces the assembly effort.

The optoelectronic light emitting device may comprise a plurality of optoelectronic semiconductor components, each of which is associated with a current source and a PWM transistor driven by a pulse-width modulated signal. The semiconductor optoelectronic components, the current sources, and the PWM transistors may have the features described above. The optoelectronic semiconductor components may be arranged in rows and columns, and the control inputs, in particular the gate terminals, of the PWM transistors arranged in a row may be interconnected. This enables row-synchronous control of the PWM transistors.

The current source may comprise at least one first transistor for generating the current and a capacitor for controlling the at least one first transistor with the capacitor voltage. The optoelectronic semiconductor component and the at least one first transistor, in particular its current carrying path, may be connected in series. The at least one first transistor may be used to control the current flow through the optoelectronic semiconductor component, and thus its luminosity. A first terminal of the capacitor may be connected to a control terminal of the at least one first transistor. The second terminal of the capacitor may be connected to a reference potential, in particular a supply or ground potential, or may be connectable to the reference potential via a corresponding switch or transistor.

The optoelectronic light emitting device may further comprise at least one second transistor for electrically coupling the capacitor to a programming line. The at least one second transistor may be connected between the programming line and the first terminal of the capacitor. When the at least one second transistor is connected such that its current carrying path is of low resistance, the capacitor is connected to the programming line and can be programmed, i.e., charged to a specific voltage.

The at least one first transistor and the at least one second transistor are realized in the first technology. In particular, the first transistor and the second transistor are TFT transistors.

It may be provided that the optoelectronic semiconductor component and the PWM transistor are connected in a first circuit line and a second circuit line is connected in parallel with the first circuit line. The second circuit line may be configured such that the current generated by the current source flows through the second circuit line when the PWM transistor is in the second state. The second circuit line may comprise a diode, in particular a semiconductor diode with a p-n junction, and one or more transistors. Furthermore, the second circuit line or at least a part thereof may be implemented in the second technology, in particular in the c-Si technology.

During the period in which the current generated by the current source does not flow through the first circuit line with the optoelectronic semiconductor component, the current flows through the second circuit line. Consequently, there is no current change but a current detour, which causes the current-driving transistor to make no contribution to the slope. Furthermore, if the second current line is configured appropriately, the drain-source voltage of the power transistor remains constant so that there is no capacitive coupling into the capacitor.

The optoelectronic light emitting device may further comprise a control unit configured to drive the PWM transistor with the pulse width modulated signal.

The optoelectronic light emitting device can be used, for example, in any type of display, i.e. optical display device, especially in automotive applications, such as dashboard displays. Such a display may comprise one or more of the optoelectronic light emitting devices described above. Furthermore, the optoelectronic light emitting device may be used in other suitable applications.

A method is provided for controlling an optoelectronic light emitting device. The optoelectronic light emitting device comprises a semiconductor optoelectronic component for generating light, a current source for generating current, and a PWM transistor. The PWM transistor is driven by a pulse-width modulated signal and enters a first state or a second state depending on the pulse-width modulated signal. The PWM transistor supplies the optoelectronic semiconductor component with the current generated by the current source in the first state, and decouples the optoelectronic semiconductor component from the current generated by the current source in the second state. The current source is realized by means of a first technology, while the PWM transistor is realized by means of a second technology.

Another method serves for manufacturing an optoelectronic light emitting device. The optoelectronic light emitting device comprises an optoelectronic semiconductor component for generating light, a current source for generating current, and a PWM transistor driven by a pulse-width modulated signal. The PWM transistor enters a first state or a second state depending on the pulse width modulated signal. Further, the PWM transistor is configured to supply the optoelectronic semiconductor component with the current generated by the current source in the first state and to decouple the optoelectronic semiconductor component from the current generated by the current source in the second state. The current source is manufactured using a first technology and the PWM transistor is manufactured using a second technology.

The method for controlling an optoelectronic light emitting device and the method for manufacturing an optoelectronic light emitting device may have the above-described embodiments of the optoelectronic light emitting device.

In the following, embodiments of the invention are explained in more detail with reference to the accompanying drawings. In these schematically show:

FIG. 1 a schematic circuit diagram of an optoelectronic light emitting device;

FIG. 2 an illustration of a PWM signal;

FIG. 3 a circuit diagram of a circuit for realizing an optoelectronic light emitting device;

FIG. 4 an illustration of the time course of programming a cell and a PWM cycle;

FIG. 5 illustrations of the current and voltage over an LED during a rising slope of a PWM pulse for an optoelectronic light emitting device manufactured with a TFT technology;

FIG. 6 an illustration of the current through an LED during successive cycles for an optoelectronic light emitting device manufactured using a TFT technology;

FIG. 7 illustrations of the current and voltage over an LED during a rising slope of a PWM pulse for an optoelectronic light emitting device with a c-Si PWM transistor;

FIG. 8 an illustration of the current through an LED during successive cycles for an optoelectronic light emitting device with a c-Si PWM transistor;

FIG. 9 a circuit diagram of a further circuit for realizing an optoelectronic light emitting device;

FIG. 10 an illustration of the current through an LED during a rising slope of a PWM pulse for the optoelectronic light emitting device shown in FIG. 9;

FIG. 11 an illustration of the current through the LED during successive cycles for the optoelectronic light emitting device shown in FIG. 9;

FIG. 12 a circuit diagram of a further circuit for realizing an optoelectronic light emitting device with an LED;

FIG. 13 a circuit diagram of a further circuit for realizing an optoelectronic light emitting device with multiple LEDs;

FIG. 14 an illustration of the time course of the control of the optoelectronic light emitting devices according to FIGS. 12 and 13;

FIGS. 15 to 19 illustration of variants of the circuit of FIG. 12;

FIG. 20 different variants of a component with a µLED and a PWM transistor; and

FIGS. 21 and 22 different variants of a circuit with an RGB trip LED.

In the following detailed description, reference is made to the accompanying drawings, which form a part of this description and in which specific embodiments in which the invention may be practiced are shown for illustrative purposes. Since components of embodiments may be positioned in a number of different orientations, the directional terminology is for illustrative purposes and is not limiting in any way. It is understood that other embodiments may be used and structural or logical changes may be made without departing from the scope of protection. It is understood that the features of the various embodiments described herein may be combined with each other, unless specifically indicated otherwise. Therefore, the following detailed description is not to be construed in a limiting sense. In the figures, identical or similar elements are provided with identical reference signs where appropriate.

FIG. 1 shows a schematic circuit diagram of an optoelectronic light emitting device 10. The optoelectronic light emitting device 10 contains an optoelectronic semiconductor component designed as an LED 11, in particular as a µLED, for generating light. The optoelectronic light emitting device 10 can furthermore contain further LEDs or µLED and can be integrated into a display.

Further, the optoelectronic light emitting device 10 includes a controllable current source 12 for generating a current and a PWM transistor 13. The current source 12 and the PWM transistor 13 are controlled by a control unit 14.

Data words 15 are input to an input of the control unit 14. The control unit 14 controls the current source 12 by means of a control signal 16 and the PWM transistor 13 by means of a control signal 17 in such a way that a data word 15 input into the control unit 14 is converted into a brightness value of the light generated by the LED 11.

The control signal 17 for driving the PWM transistor 13 is a pulse-width modulated signal. The PWM transistor 13 enters a first state or a second state depending on the pulse width modulated signal. In the first state of the PWM transistor 13, the LED 11 is supplied with the current generated by the current source 12, while in the second state of the PWM transistor 13, the LED 11 is decoupled from the current generated by the current source 12, i.e., is not supplied with the current.

In the present embodiment, the PWM transistor 13 is designed as a field effect transistor. The gate terminal of the PWM transistor 13 is driven by the control signal 17. The drain-source path of the PWM transistor 13 is connected between the LED 11 and the current source 12. In the first state of the PWM transistor 13, the drain-source path has a low impedance and in the second state it has a high impedance.

Alternative circuits of the LED 11, the current source 12 and the PWM transistor 13 are described further below. In particular, the PWM transistor 13 can also be arranged in parallel with the LED 11.

The current source 12 or the transistors included in the current source 12 are manufactured using a first technology, while the PWM transistor is manufactured using a second technology that has a higher carrier mobility than the first technology.

As an example, a control signal 17 plotted against time t, i.e. a pulse width modulated signal applied to the gate terminal of the PWM transistor, is shown in FIG. 2. The control signal 17 can enter two discrete values, i.e. a first value 18 and a second value 19. During the period in which the control signal 17 enters the first value 18, a rectangular pulse with a pulse width $t_1$ is generated. The pulse is repeated periodically with a period length T. When the control signal 17 enters the first value 18, i.e. during the duration $t_1$ of the pulse, the drain-source path of the PWM transistor 13 is of low resistance. Otherwise, the drain-source path is high-impedance. In particular, the control unit 14 can control the pulse width $t_1$ of the pulse.

FIG. 3 shows a schematic circuit diagram of a circuit 20 which can be used to realize the optoelectronic light emitting device 10 shown in FIG. 1. The circuit 20 is used to drive the LED 11. Of course, further LEDs can be provided, arranged in rows and columns, for example, and driven by means of analog circuits.

The circuit 10 comprises a controllable current source formed as a 3T1C cell having three transistors 21, 22, 23 formed as field effect transistors and a capacitor 24. Furthermore, the circuit 20 comprises the PWM transistor 13. The circuit 20 may therefore also be referred to as a 4T1C cell.

The current-carrying paths, i.e. the drain-source paths, of the transistors 21, 22, 23 are connected in parallel. The LED 11, the drain-source path of the PWM transistor 13 and the transistor group consisting of the transistors 21, 22, 23 are connected in series.

In the present embodiment, a supply potential VDD is applied to the anode terminal of the LED 11.

The gate terminal of the PWM transistor 13 is driven by a signal S1.

A first terminal of the capacitor 24 is connected to the gate terminals of the transistors 21, 22, 23. A second terminal of the capacitor 24 is connected to a ground potential GND.

Furthermore, the circuit 20 comprises transistors 25, 26. The transistors 25, 26 are each connected with one terminal of their drain-source paths between the transistors 21, 22, 23 and the PWM transistor 13. The other terminal of the drain-source path of transistor 26 is connected to a programming line and has a signal sense applied to it. The other terminal of the drain-source path of transistor 25 is connected to the first terminal of capacitor 24.

The gate terminals of transistors 25, 26 are driven by a signal ProgEn.

In FIG. 3, two different areas 27, 28 of the circuit 20 are indicated by dashed lines. Area 27 was manufactured using the first technology and area 28 was manufactured using the second technology. In the present embodiment, the first technology is a TFT technology and the second technology is a c-Si technology. Consequently, the transistors 21, 22, 23, 25, 26 are thin film transistors (TFTs). The PWM transistor 13 is made of crystalline silicon. For example, the PWM transistor 13 may be a µIC. The PWM transistor 13 may further be manufactured as a printable µ-transistor or may be locally manufactured as a recrystallized single transistor using a laser beam.

In circuit 20, the actual current driver consists of transistors 21, 22, 23. When in the ProgEn=VDD and S1=GND state, the drain-source paths of transistors 25, 26 are low impedance and the drain-source path of PWM transistor 13 is high impedance, a current can be impressed across the programming line which, since PWM transistor 13 is closed, charges or programmes the transistor 24 and produces exactly the gate-source voltage on the transistor network of transistors 21, 22, 23 necessary to drive the desired rated current.

If in the state ProgEn=GND and S1=VDD the drain-source paths of the transistors 25, 26 are high impedance and the drain-source path of the transistor 13 is low impedance, the corresponding current flows through the LED 11, which is specified by the voltage of the capacitor 24. This can be modulated via the signal S1 driving the PWM transistor 13 in the sense of a PWM.

In FIG. 4 the signals S1 and ProgEn as well as the current $I_{LED}$ flowing through the LED 11 are plotted against time t. First, the state ProgEn=VDD and S1=GND is switched to allow the cell or capacitor 24 to be programmed. Then, the PWM cycle is performed with ProgEn at GND and the PWM signal S1 driving the PWM transistor 13 with a predetermined pulse width.

FIGS. 5 and 6 show measured curved for circuit 20, and in this case both areas 27 and 28 were manufactured using TFT technology. In FIG. 5, the current $I_{LED}$ and voltage $V_{LED}$ across LED 11 are shown during a rising slope of a PWM pulse. The maximum rise time, i.e., the time between the two dashed lines shown in FIG. 5, is about 10 ns, which shows that the circuit 20 is generally suitable for PWM dimming.

FIG. 6 shows the decrease in current $I_{LED}$ due to switching of PWM transistor 13 during successive cycles. The reason for the decrease in current $I_{LED}$ is the injection of charge into capacitor 24 with each PWM pulse. However, the current $I_{LED}$ decreases only slightly over the 500 cycles shown during which capacitor 24 is not recharged. Consequently, the effect of the switching pulses in the load path on the charge of capacitor 24 can be neglected.

For the curves shown in FIGS. 7 and 8, respectively, the same measurements were made as for FIGS. 5 and 6, respectively, but in this case region 27 of circuit 20 was manufactured using TFT technology, while region 28 was manufactured using c-Si technology.

FIG. 7 shows that the rise time has been significantly reduced by making the PWM transistor 13 from crystalline silicon. The maximum rise time is now only about 5 ns. Furthermore, there is almost no change in the current $I_{LED}$ over several cycles, as FIG. 8 shows.

FIG. 9 shows a schematic diagram of a circuit 30 based on the circuit 20 shown in FIG. 3.

The portion 28 of the circuit 30 manufactured using the second technology includes a first circuit line 31 and a second circuit line 32 connected in parallel with the first circuit line 31. The first circuit line 31 comprises the LED 11 and the PWM transistor 13.

The second circuit line 32 includes a pn diode 33 and transistors 34, 35 formed as field effect transistors. The drain-source paths of transistors 34, 35 are connected in series with the pn diode 33. The gate terminal of transistor 34 is driven by signal S1. The gate terminal of transistor 35 is driven by signal ProgEn.

Transistors 34, 35 are designed as p-channel transistors, whereas transistors 13, 25, 26 are designed as n-channel transistors.

The current generated by transistors 21, 22, 23 flows through the second circuit line 32 when the drain-source path of PWM transistor 13 is at high impedance.

Figure 1:
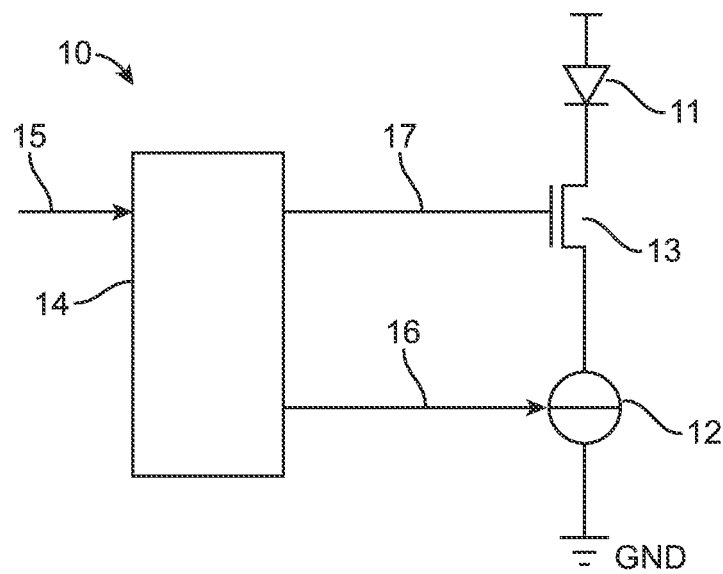
Figure 2:
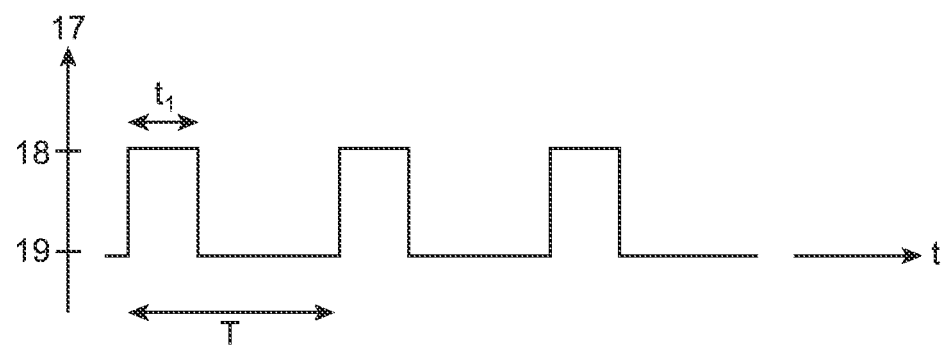
Figure 3:
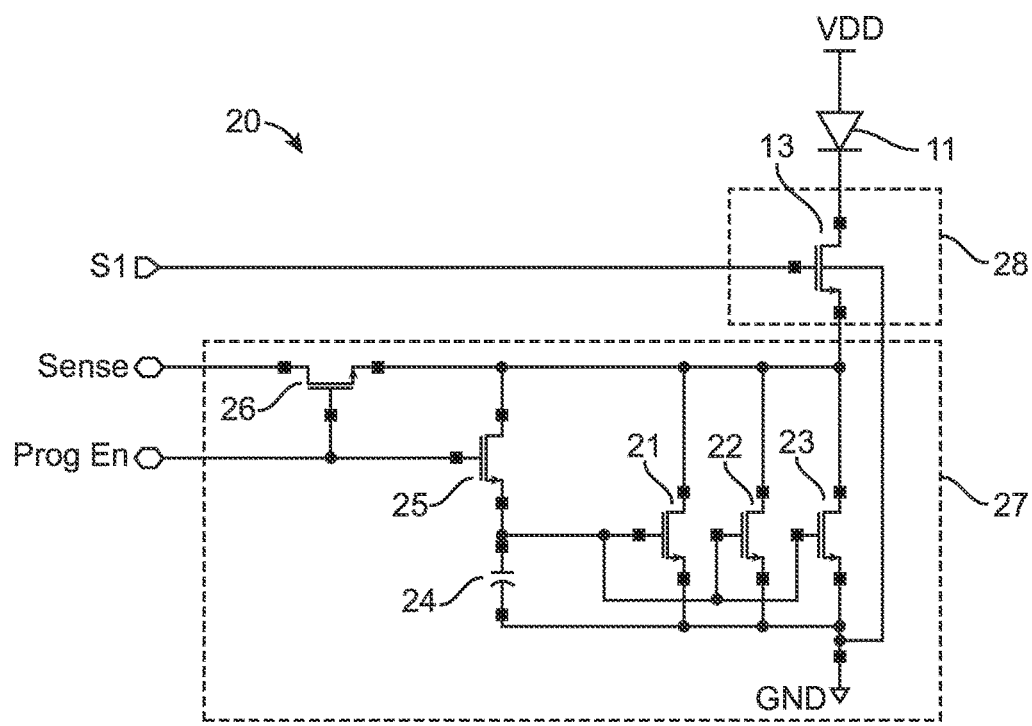
Figure 4:
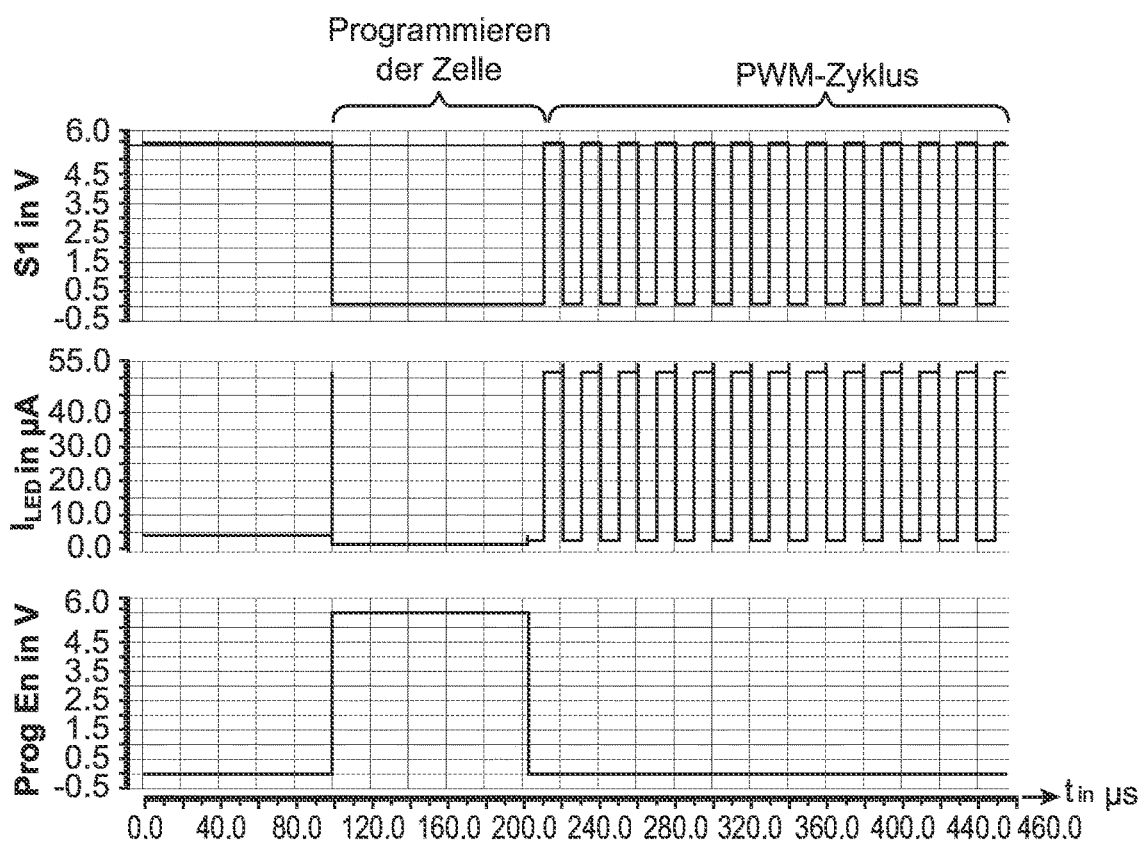
Figure 5:
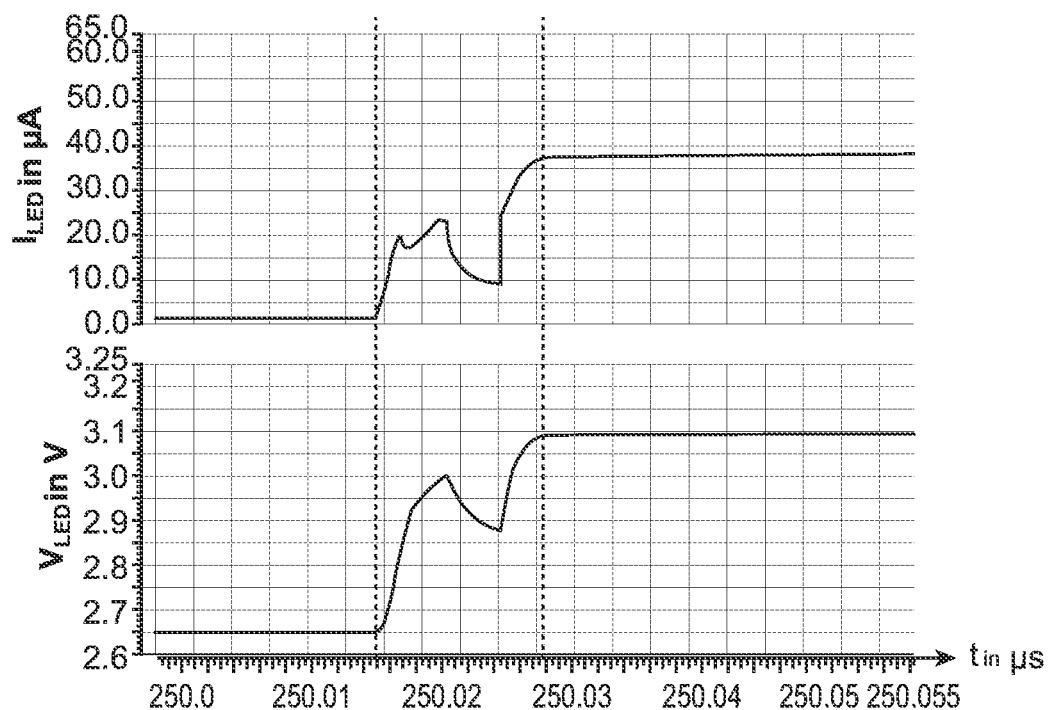
Figure 6:
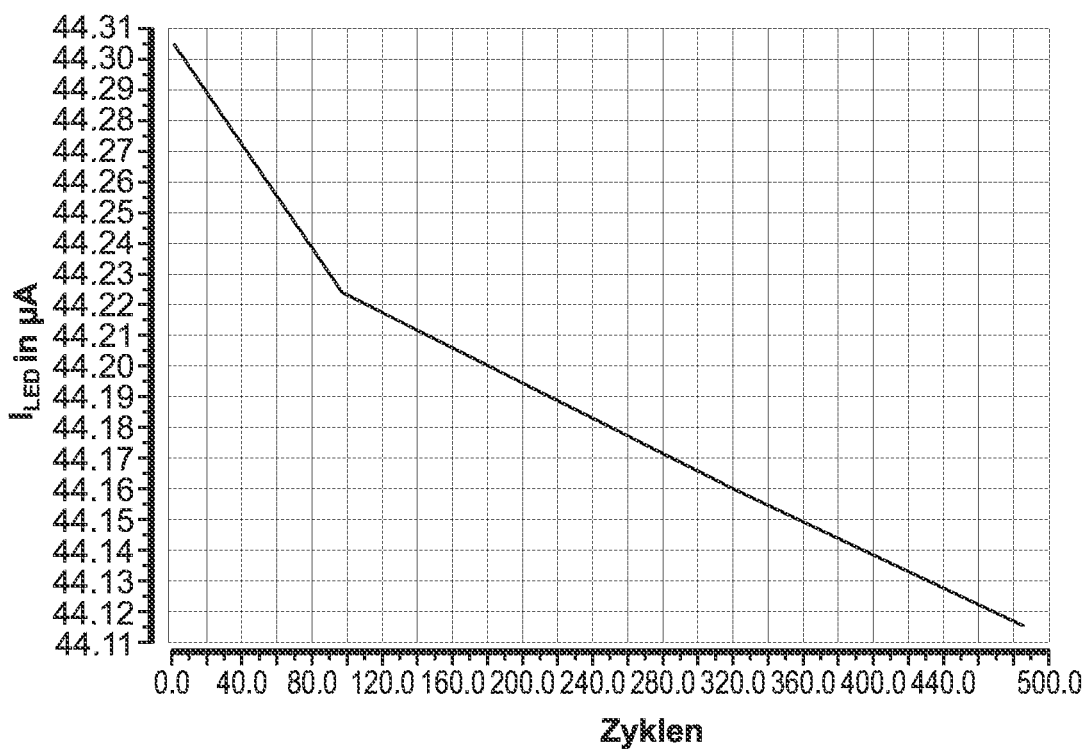
Figure 7:
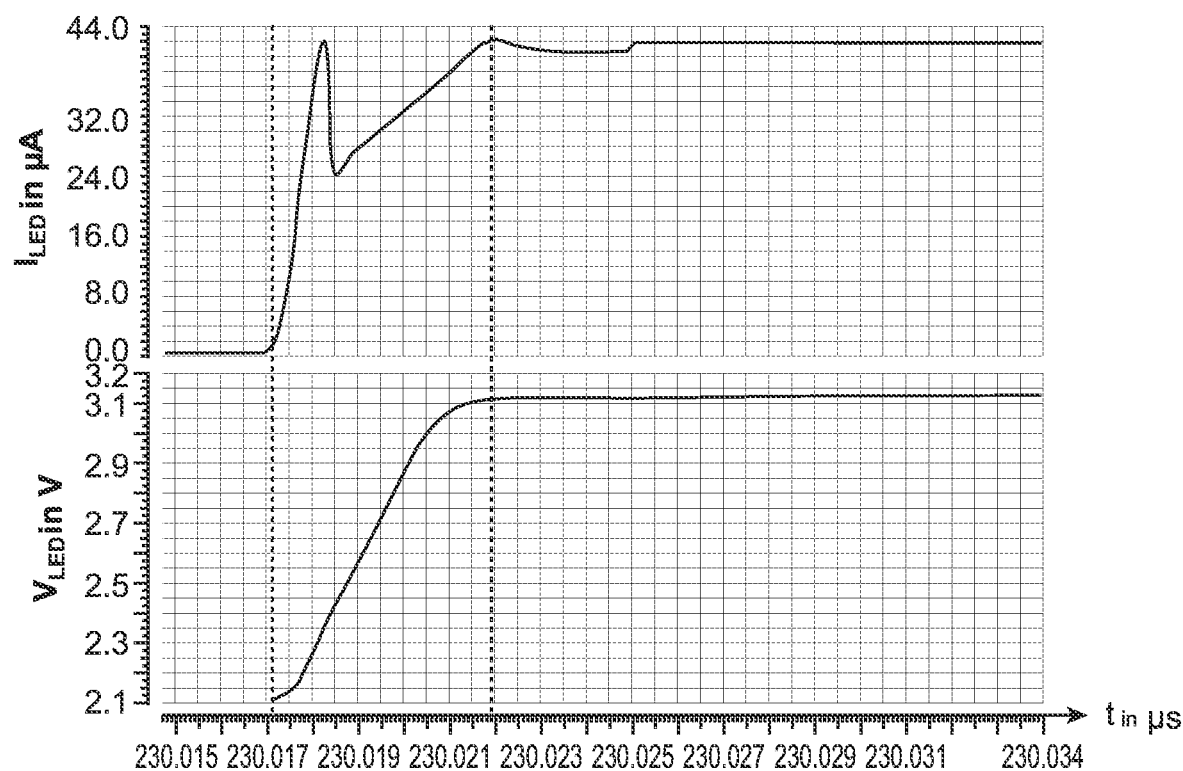
Figure 8:
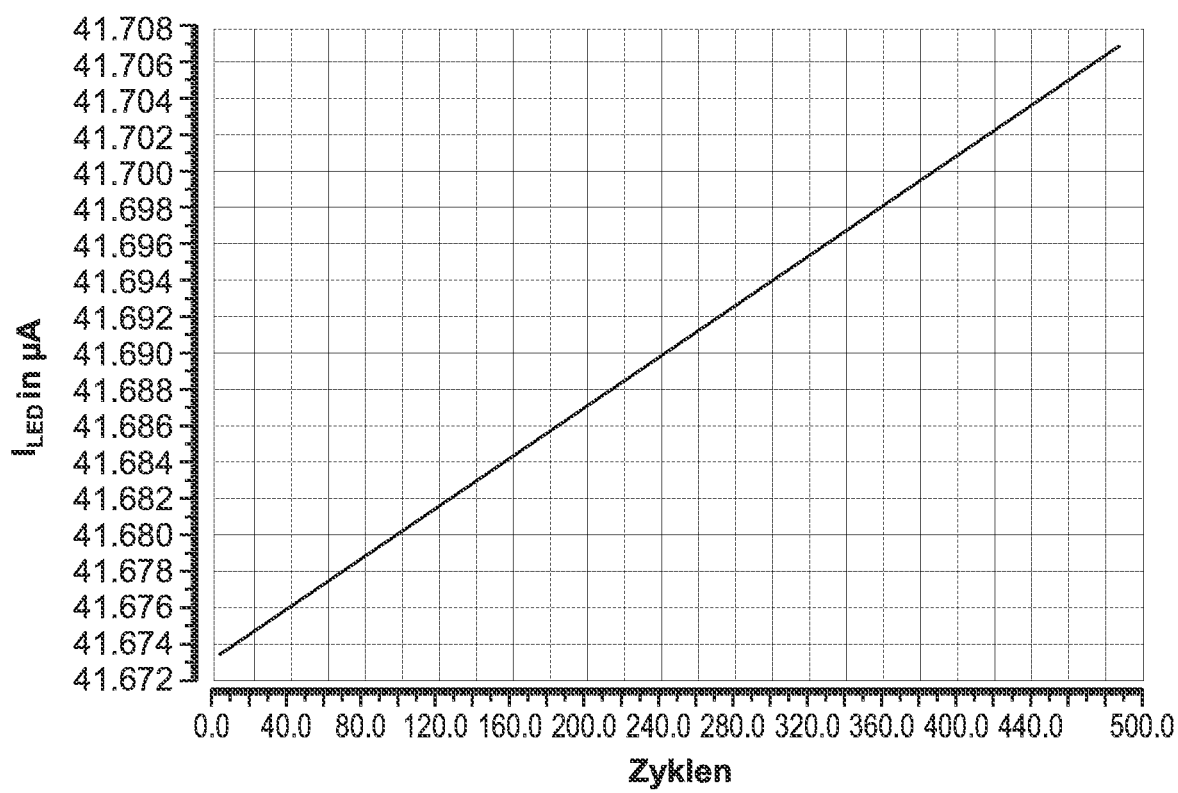
Figure 9:
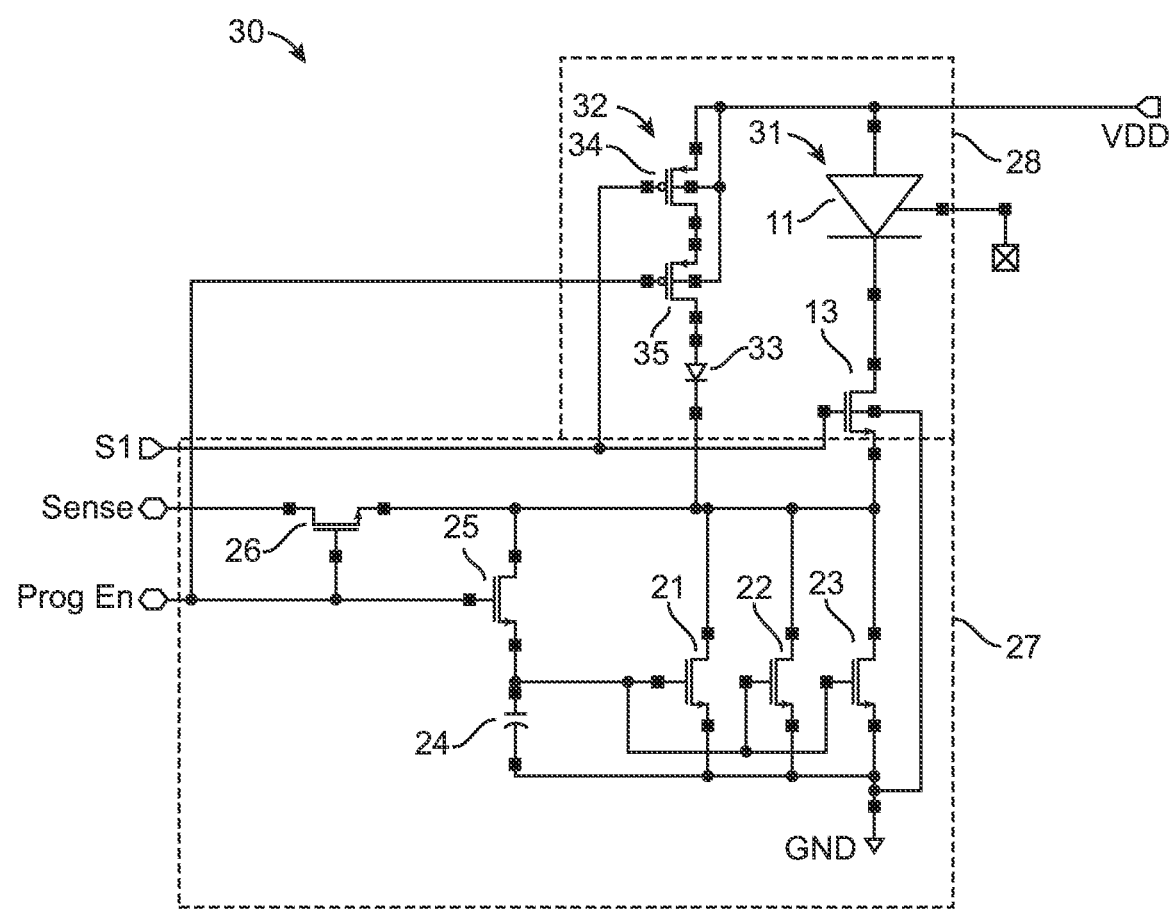
Figure 10:
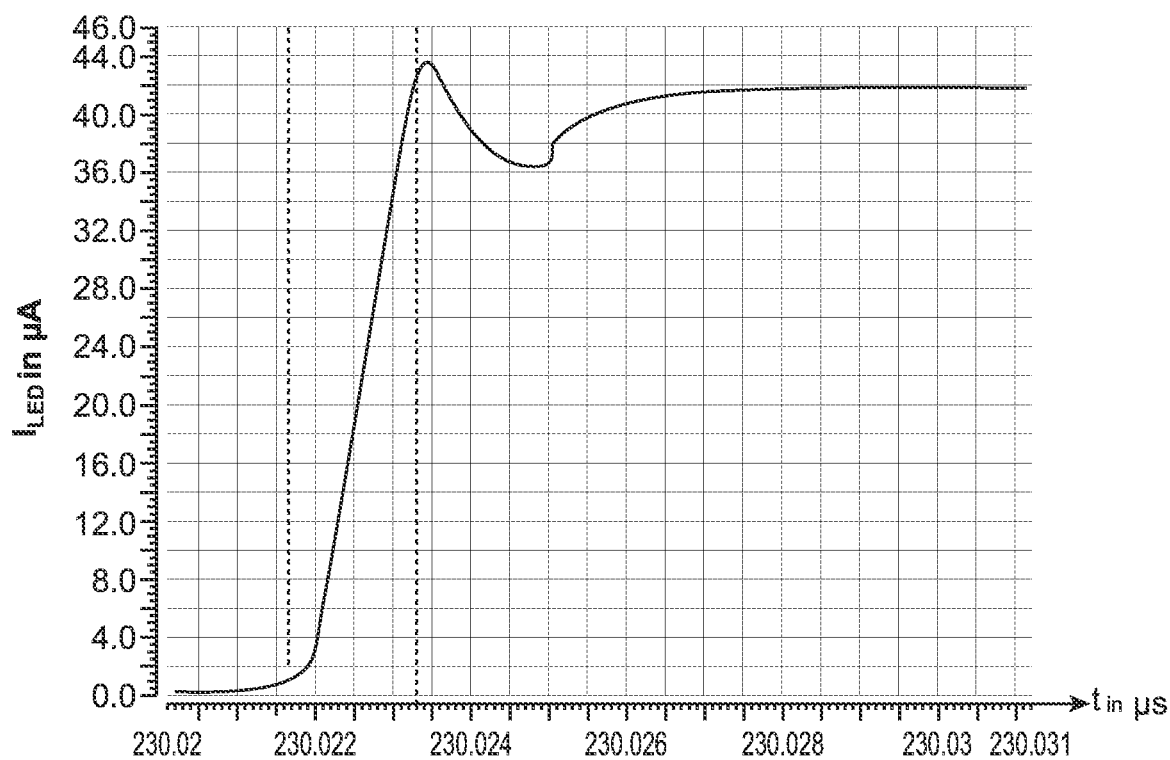
FIG. 10 shows, analogously to FIG. 7, the current $I_{LED}$ through LED 11 of circuit 30 during a rising slope of a PWM pulse. The maximum rise time, i.e. the time between the two dashed lines shown in FIG. 10, is only about 2 ns.
Figure 11:
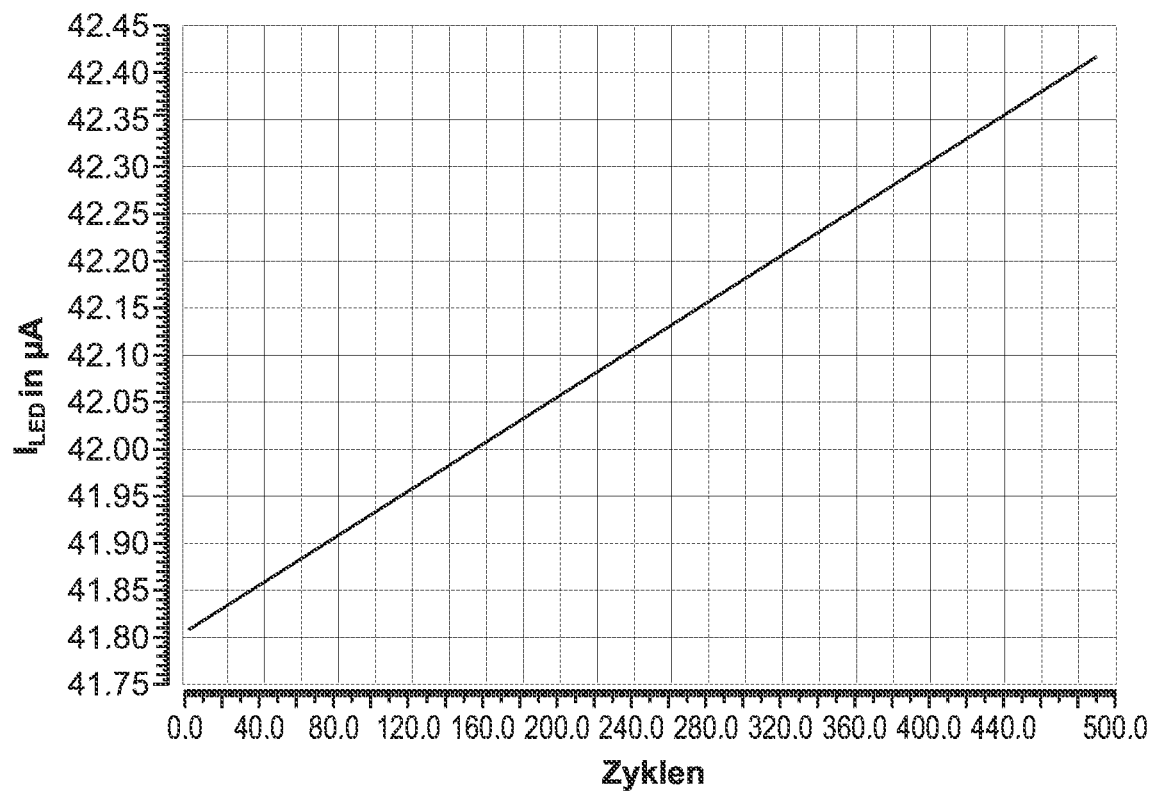
FIG. 11 shows the magnitude of current $I_{LED}$ during successive cycles for circuit 30. The change in current $I_{LED}$ is very small.
Figure 12:
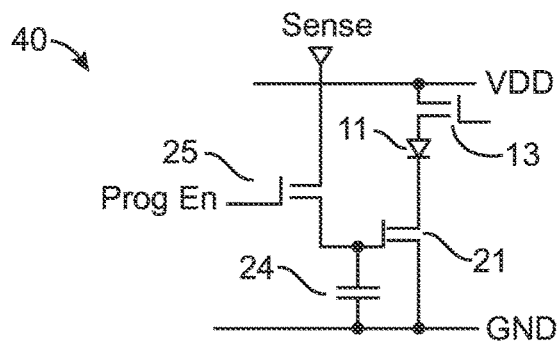

FIG. 12 shows a schematic circuit diagram of a circuit 40, which is a simplified variant of circuit 20. Circuit 40 contains only transistor 21 as the current-driving transistor. The capacitor 24 is programmed via the transistor 25. Furthermore, the PWM transistor 13 manufactured by means of c-Si technology is connected between the supply potential VDD and the LED 11.

Figure 13:
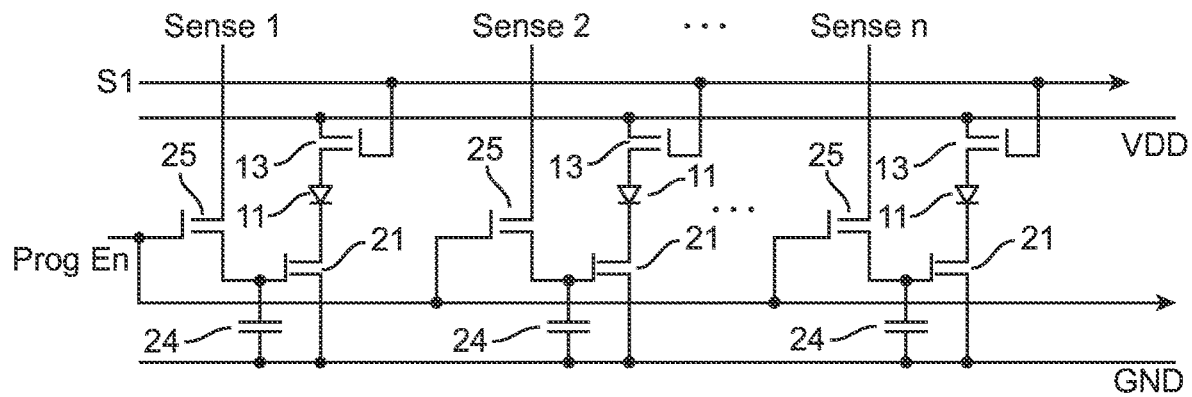

FIG. 13 shows several LEDs 11 arranged in one row of a display, each of which is driven by the circuit 40 known from FIG. 12. The gate terminals of the PWM transistors 13 arranged in the same row are connected to each other and are driven by the signal S1. Furthermore, the gate terminals of the transistors 25 arranged in the same row are driven by the signal ProgEn.

Figure 14:
Figure 14:
Figure 14:

FIG. 14 shows the timing of the control. The top row of FIG. 14 shows the signal S1 applied to the gate terminals of the PWM transistors 13. The middle row of FIG. 14 shows the gate-source voltage $V_{GS}$ of one of the transistors 21, and the bottom row of FIG. 14 shows the signal ProgEn applied to the gate terminals of the transistors 25.

To program the capacitors 24, the signal ProgEn is switched on so that the drain-source paths of the transistors 25 are low impedance and the capacitors 24 can be charged to a respective voltage by means of the signals Sense 1, Sense 2, . . . Sense n can be charged to a respective voltage. As a result, the desired gate-source voltages $V_{GS}$ are generated at the transistors 21. These voltages subsequently define the current $I_{LED}$ through the respective LED 11.

After programming the capacitors 24, the pulse width modulated signal S1 is applied to the gate terminals of the PWM transistors 13. The pulse-width modulated signal S1 only switches the current $I_{LED}$ through the respective LED 11 on and off.

The row synchronous signal S1 serves as global dimming signal. Grayscale and calibration are realized by the TFT part, which can also be called slow PWM (compared to fast PWM by means of the PWM transistors 13).

An alternative solution with a switching of the entire voltage $V_{LED}$ via the LEDs 11 is not preferred for power stability reasons.

In contrast, the switching of the PWM transistors 13 requires only a few μA and can therefore also be implemented row-parallel to the switching of the gate signal ProgEn without any problems.

If the row-synchronous signal S1 is used as a global dimming signal, the signal S1 can be shifted to the respective next line with a shift register analog to the signal ProgEn. This can be realized with only little effort.

Since the signal S1 only has an on/off task, i.e. it does not control the current $I_{LED}$, no complex designs regarding temperature, drift or other compensations are necessary here. Consequently, only the PWM transistor 13 has to switch at high speed between an on and an off state.

FIG. 13 shows a so-called common anode arrangement in which the supply potential VDD is applied to the anode terminals of the LEDs 11. Alternatively, the LEDs 11 can also be arranged in a so-called common cathode arrangement, in which the cathode terminals of the LEDs 11 are connected to the ground potential GND.

FIGS. 15 to 19 show variants of the circuit 40 shown in FIG. 12.

Figure 15:
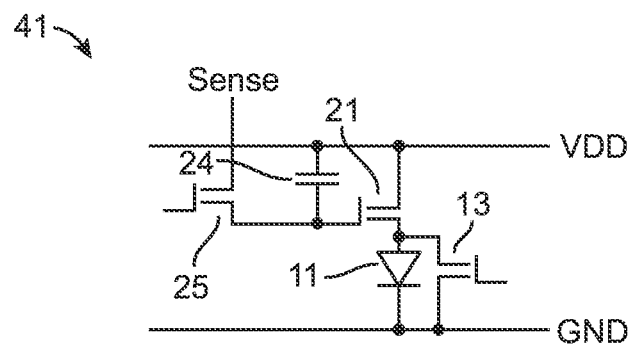
Figure 16:
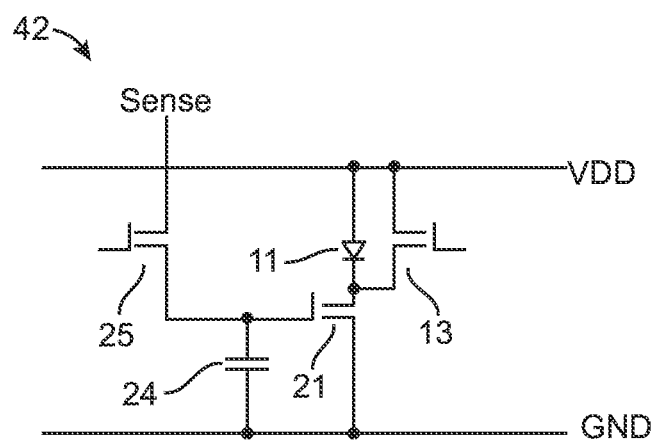

In the circuits 41 and 42 shown in FIGS. 15 and 16, respectively, the fast PWM transistor 13 is connected in parallel with the LED 11, with the circuits in FIGS. 15 and 16 being designed in form of a common cathode arrangement and a common anode arrangement, respectively. Instead of interrupting the current $I_{LED}$ through the LED 11, the current $I_{LED}$ is short-circuited by the PWM transistor 13 in FIGS. 15 and 16. Thus, the slower TFT transistor 21, which is designed as PMOS in FIG. 15 or as NMOS in FIG. 16, is not significantly involved in the modulation of the LED cross current. Only the change in the transverse current caused by the rapid change in the voltage $V_{DS}$ of transistor 21, motivated by the finite internal resistance of the current source mapped by transistor 21, must be borne by the slower transistor.

However, in case of circuits 41, 42 the maximum LED current is drawn for a longer time even with small pulse widths. To reduce the current consumption, the slow TFT transistor 21 can be switched off after short-circuiting the LED 11.

Figure 17:
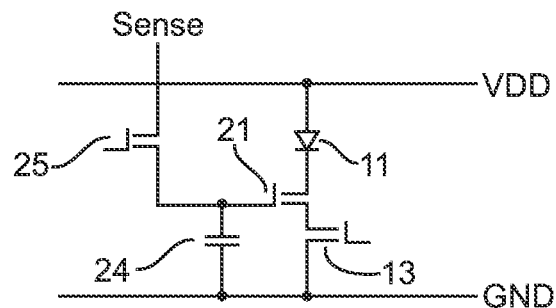

The circuit shown in FIG. 17 differs from the circuit shown in FIG. 12 in that the PWM transistor 13 is arranged between the transistor 21 and the ground potential GND.

Figure 18:
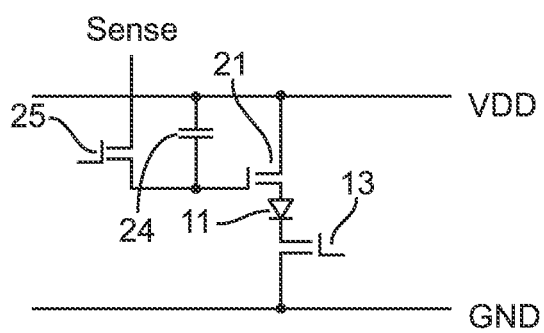
Figure 19:
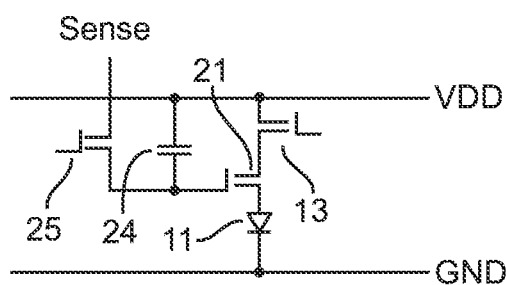

In FIGS. 18 and 19, one terminal of the capacitor 24 has the supply potential VDD applied to it. Furthermore, in FIG. 18, the LED 11 is arranged between the transistor 21 and the PWM transistor 13. In FIG. 19, the transistor 21 is arranged between the PWM transistor 13 and the LED 11, and the cathode of the LED 11 has the ground potential GND applied to it.

An advantage of the circuits described above is that a large part of the respective circuit can be realized in traditional TFT electronics, e.g. IGZO or LTPS. This includes, among other things, current dimming, e.g. 7 bits, and additionally a simple PWM, e.g. 8 bits with e.g. >1 μs shortest LTPS pulse width.

Higher-level fast PWM with ultra-short pulses, e.g. 10 ns, is achieved by c-Si, i.e. crystalline silicon. The fast PWM can be achieved e.g. by a Si-(μ)chip, i.e. a hybrid concept, or by locally generated crystalline silicon, e.g. by laser recrystallization. Since the "fast" part of the circuit is spatially very limited (e.g., only a simple on/off FET in the simplest case), the additional cost (silicon area) is kept within limits. In addition, an external dimmer (combination TFT+ext. dimmer) can be dispensed with. Among other things, this saves component height or display height and increases efficiency.

The PWM transistor 13 can already be integrated in the μLED and in this case is supplied by the "μLED component". This reduces e.g. the costs for the external placing/printing of e.g. μ-transistors or the additional recrystallization of a TFT transistor. This is technologically possible for all three colors red, green and blue. Since both GaAs and GaN have high charge carrier mobilities, fast PWM can be realized as a result. Since the PWM transistor 13 has a pure on/off functionality, the requirements are low.

The switching functionality can also be integrated into a sub-mount, carrier or interposer of the LED. It is conceivable here to mount RGB trip LEDs on an interposer, for example, which contains the PWM transistor. This is advantageous because the PWM transistor has approximately the same geometry as the (μ)LED and thus no additional area is consumed. Furthermore, only one additional pin or connection is required for the common PWM gate, for example.

Figure 20:
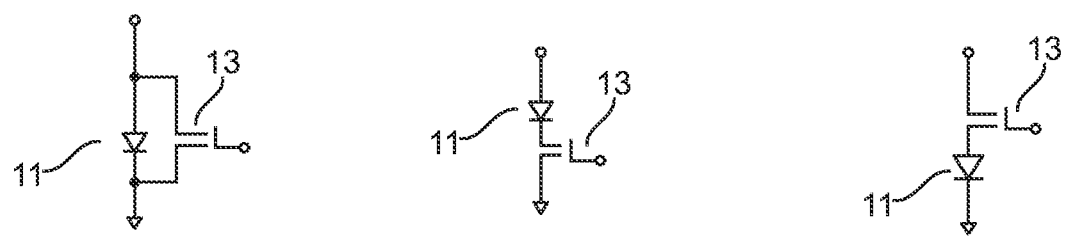

FIG. 20 shows three different variants in which the PWM transistor 13 is integrated in the μLED. In one variant, the PWM transistor 13 is arranged in parallel to the LED 11. In the other two variants, the drain-source path of the PWM transistor 13 is connected to the cathode or anode of the PWM transistor 13. Each of the components shown in FIG. 20 contains 3 connection pins.

If the c-Si PWM transistor 13 is implemented as a μIC, several PWM switches can also be accommodated in one μIC. If, for example, 1 μIC is designed for 4 RGB pixels (12 LEDs), this μIC has "only" e.g. one PWM switch signal pad, 12 source or drain pads and one VDD or GND pad, i.e. a total of e.g. 18 pads. Due to its simplicity, the system can also be scaled to e.g. 16 pixels. Since only 1 transistor is required per LED, for example, high pixel densities can also be realized.

Figure 21:
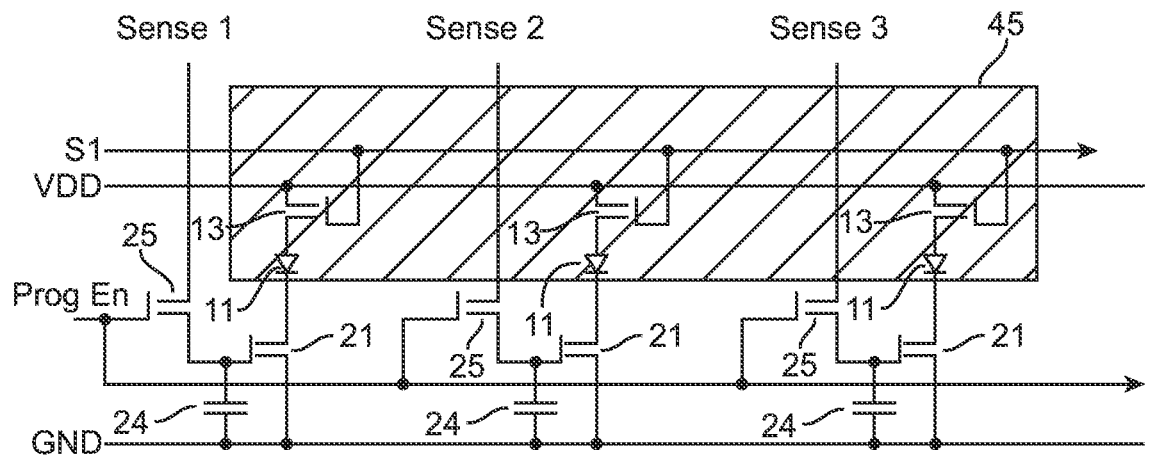

FIG. 21 shows the circuit known from FIG. 13, where three LEDs 11 with the colors red, green and blue together with the associated PWM transistors 13 are integrated in a common substrate as an RGB trip LED, e.g. printable. The component 45 shown in FIG. 21 with the three LEDs 11 and the three PWM transistors 13 has, for example, at least 5 connections.

30

Figure 22:
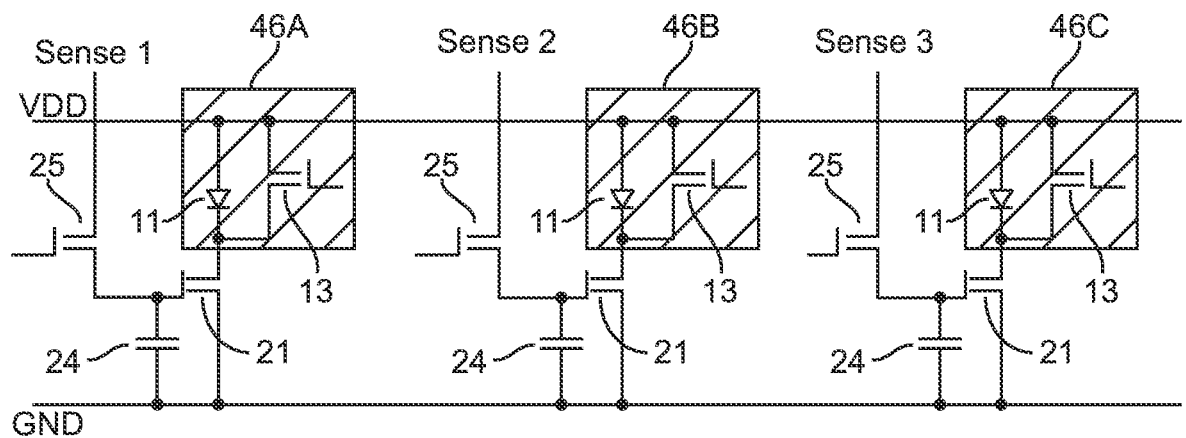

FIG. 22 shows a circuit with three LEDs 11 of the colors red, green and blue. The drive circuits of the LEDs 11 correspond to the circuit in FIG. 16. Alternatively, the drive circuits can also be designed as a common cathode arrangement. The three LEDs 11 and the associated PWM transistors 13 can be integrated in a common substrate as an RGB trip LED. In FIG. 22, areas 46A, 46B, 46C are marked that are encompassed by the common substrate. For clarity, areas 46A, 46B, 46C are shown separately.

LIST OF REFERENCE SIGNS

10 optoelectronic light emitting device
11 LED
12 current source
13 PWM transistor
14 control unit
15 data word
16 control signal
17 control signal
18 first value
19 second value
20 circuit
21 transistor
22 transistor
23 transistor
24 capacitor
25 transistor
26 transistor
27 area
28 area
30 circuit
31 first circuit line
32 second circuit line
33 pn diode
34 transistor
35 transistor
40 circuit
41 circuit
42 circuit
45 component
46A area
46B area
46C area

The invention claimed is:

1. An optoelectronic light emitting device, with:
an optoelectronic semiconductor component configured to generate light,
a current source configured to generate a current, and
a PWM transistor which is driven by a pulse-width-modulated signal, which enters a first state or a second state as a function of the pulse-width-modulated signal and is configured to supply the optoelectronic semiconductor component with the current generated by the current source in the first state and to decouple it from the current generated by the current source in the second state,
wherein the current source is manufactured by a first technology and the PWM transistor is manufactured by a second technology,
wherein the second technology has a higher charge carrier mobility than the first technology, and
wherein the first technology is a TFT technology and the second technology is a c-Si technology.

2. The optoelectronic light emitting device according to claim 1, wherein the optoelectronic semiconductor component, the current source and the PWM transistor are connected in series.

3. The optoelectronic light emitting device according to claim 1, wherein the optoelectronic semiconductor component and the PWM transistor are connected in parallel.

4. The optoelectronic light emitting device according to claim 1, wherein the PWM transistor is an IC, in particular a μIC.

5. The optoelectronic light emitting device according to claim 1, wherein the optoelectronic semiconductor component is a μLED.

6. The optoelectronic light emitting device according to claim 5, wherein the PWM transistor is integrated into the μLED.

7. The optoelectronic light emitting device according to claim 1, wherein the optoelectronic light emitting device comprises a plurality of optoelectronic semiconductor components, each of which is associated with a current source and a PWM transistor driven by a pulse-width modulated signal, and wherein the optoelectronic semiconductor components are arranged in rows and columns and control inputs of the PWM transistors arranged in a row are connected to one another.

8. The optoelectronic light emitting device according to claim 1, wherein the current source comprises at least one first transistor for generating the current and a capacitor for controlling the at least one first transistor with the capacitor voltage.

9. The optoelectronic light emitting device according to claim 8, wherein the optoelectronic light emitting device comprises at least a second transistor for coupling the capacitor to a programming line.

10. The optoelectronic light emitting device according to claim 1, wherein the optoelectronic semiconductor component and the PWM transistor are arranged in a first circuit line and a second circuit line is connected in parallel to the first circuit line, and wherein the second circuit line is configured such that the current generated by the current source flows through the second circuit line when the PWM transistor is in the second state.

11. The optoelectronic light emitting device according to claim 1, wherein the optoelectronic light emitting device comprises a control unit which is configured to drive the PWM transistor with the pulse-width modulated signal.

12. A display comprising one or more optoelectronic light emitting devices according to claim 1.

13. A method for controlling an optoelectronic light emitting device,
wherein the optoelectronic light emitting device comprises an optoelectronic semiconductor component for generating light, a current source for generating current, and a PWM transistor,
wherein the PWM transistor is driven with a pulse width modulated signal and the PWM transistor enters a first state or a second state depending on the pulse width modulated signal,
wherein the PWM transistor supplies the optoelectronic semiconductor component with the current generated by the current source in the first state and decouples it from the current generated by the current source in the second state,
wherein the current source is manufactured by a first technology and the PWM transistor is manufactured by a second technology,
wherein the second technology has a higher charge carrier mobility than the first technology, and
wherein the first technology is a TFT technology and the second technology is a c-Si technology.

14. A method for manufacturing an optoelectronic light emitting device,
wherein the optoelectronic light emitting device comprises an optoelectronic semiconductor component for generating light, a current source for generating current, and a PWM transistor driven by a pulse width modulated signal, wherein the PWM transistor enters a first state or a second state depending on the pulse width modulated signal, and the PWM transistor is configured to supply the optoelectronic semiconductor component with the current generated by the current source in the first state and to decouple the optoelectronic semiconductor component from the current generated by the current source in the second state, wherein the current source is manufactured using a first technology and the PWM transistor is manufactured using a second technology, wherein the second technology has a higher charge carrier mobility than the first technology, and wherein the first technology is a TFT technology and the second technology is a c-Si technology.

* * * * *